(12) United States Patent
Hashimoto

(10) Patent No.: US 7,323,384 B2
(45) Date of Patent: Jan. 29, 2008

(54) METHOD OF MANUFACTURING SEMICONDUCTOR DEVICE

(75) Inventor: Keiichi Hashimoto, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 150 days.

(21) Appl. No.: 11/276,402

(22) Filed: Feb. 28, 2006

(65) Prior Publication Data
US 2006/0194388 A1    Aug. 31, 2006

(30) Foreign Application Priority Data
Feb. 28, 2005    (JP)    ............... 2005/052284

(51) Int. Cl.
*H01L 21/8247* (2006.01)

(52) U.S. Cl. ............... 438/261; 257/E21.179; 438/954

(58) Field of Classification Search ........ 438/257–267, 438/954; 257/E21.179
See application file for complete search history.

(56) References Cited

U.S. PATENT DOCUMENTS 7,074,677 B1 *   7/2006   Halliyal et al. ............. 438/261
2004/0197995 A1 * 10/2004 Lee et al. .................. 438/257

FOREIGN PATENT DOCUMENTS

JP    10/223783 A    8/1998
JP    2003/78045 A   3/2003

* cited by examiner

*Primary Examiner*—Richard A. Booth
(74) *Attorney, Agent, or Firm*—Rabin & Berdo, P.C.

(57) ABSTRACT

A method of manufacturing a semiconductor memory device comprises the steps of: preparing a semiconductor substrate having a gate insulation film and a gate electrode, the gate insulation film being formed on a predetermined active region in the semiconductor substrate, and the gate electrode being formed on the gate insulation film; forming a first insulation film covering the gate electrode and at least a part of the semiconductor substrate; charging the first insulation film; and forming a second insulation film for charge storage on the first insulation film.

16 Claims, 8 Drawing Sheets

METHOD OF MANUFACTURING SEMICONDUCTOR DEVICE

BACKGROUND OF THE INVENTION

1. Field of the Invention

The present invention relates to a method of manufacturing a semiconductor memory device which in particular has a MONOS structure of a two bits per cell system, and such semiconductor memory device.

2. Background Information

As an example of a conventional semiconductor memory device, there is a so called stack type nonvolatile semiconductor memory device which includes a floating gate electrode and a control gate electrode, and stores data by accumulating electric charges into the floating gate (e.g. Japanese Laid-Open Patent Application No. 10-223783 (hereinafter to be referred to as Patent Reference 1)).

In such stack type nonvolatile semiconductor memory device, data is written into the floating gate electrode by letting a Fowler-Nordheim current flow into the floating gate electrode from a semiconductor substrate by impressing voltages to the semiconductor substrate, a source and a drain formed on the semiconductor substrate, and the control gate electrode, respectively.

On the other hand, there is another type of conventional nonvolatile semiconductor memory device which has been developed with the intention of miniaturizing the device, and has a so called MONOS (metal oxide nitride oxide silicon) structure where a nitride film is used as a charge storage portion instead of the floating gate electrode.

The conventional nonvolatile semiconductor memory device having the MONOS structure includes a structure in which a dielectric body of a multilayer structure is formed between a semiconductor layer (e.g. a silicon substrate) where a channel is formed and the floating gate electrode (e.g. Japanese Laid-Open Patent Application No. 2003-78045 (hereinafter to be referred to as Patent Reference 2)). This multilayer structure, for instance, has a silicon nitride film and two silicon oxide films (i.e. first and second silicon oxide films) sandwiching the silicon nitride film.

Here, the silicon nitride film in the dielectric body functions as a charge storage portion. The first silicon oxide film formed between the semiconductor layer and the silicon nitride film functions as a potential barrier between the semiconductor layer and the silicon nitride film. On the other hand, the second silicon oxide film formed between the silicon nitride film and the floating gate electrode functions as a film for preventing the electric charges stored in the silicon nitride film from leaking toward a side of the floating gate electrode, unnecessary electric charges from flowing into the silicon nitride film from the floating gate electrode, and so forth.

Writing data to the silicon nitride film described above can be conducted by impressing writing potentials to the floating gate electrode and to a drain region, which is formed in the semiconductor layer as being adjacent to the floating gate electrode under the floating gate electrode, respectively. At this time, a reference voltage or such can be impressed to a source region. By impressing voltages in this way, a channel is formed in the semiconductor layer underneath the floating gate electrode, and carriers bursting out of the drain region flow into this channel. These carriers turn into hot carriers by being accelerated on the side of the source region. The hot carriers generated here penetrate through the first silicon oxide film functioning as a potential barrier. Then the hot carriers, having penetrated through the first silicon oxide film, are trapped and stored in the silicon nitride film functioning as a charge storage portion. In this way, data writing to the silicon nitride film is conducted.

By applying such MONOS structure described above, it is possible to manufacture a so called two bits per cell system nonvolatile semiconductor memory device which stores two bits in a single cell.

In this two bits per cell system nonvolatile semiconductor memory device, a dielectric body having a multilayer structure in which a silicon nitride film is sandwiched between two silicon oxide films (i.e. first and second silicon oxide films), is formed on a semiconductor layer along each side of a floating gate electrode.

However, according to the conventional method of writing with respect to the nonvolatile semiconductor memory device having a MONOS structure, the dielectric bodies on both sides of the floating gate electrode will not have electric fields in a vertical direction impressed thereto due to structural factors. Therefore, particularly as for the electric field in the vertical direction impressed to the dielectric body formed on the semiconductor layer, i.e., the electric field that leaps across the first silicon oxide film that functions as a potential barrier, there are merely vertical components in an electric field leaking from the floating gate electrode.

If there are merely vertical components in the electric field leaking from the floating gate electrode as the electric field is impressed to the dielectric body, even when hot carriers are implanted having energy surpassing the potential of the potential barrier where an interface between the semiconductor layer and the first silicon oxide film is formed, there is a possibility that these hot carriers will not be able to reach the silicon nitride film or an interface between the first silicon oxide film and the silicon nitride film, and will be trapped in the first silicon oxide film. In this case, if the semiconductor layer is a silicon substrate, for instance, a potential barrier of approximately 3.2 eV (electron volt) will be formed in the interface between the silicon and the silicon oxide.

The hot carriers trapped in the first silicon oxide film in the above described way can possibly escape through the first silicon oxide film easily by leaving them at high temperature. In other words, there is a possibility that the conventional structure does not have a sufficient charge retention characteristic to cope with high temperature abandonment.

Both Patent References 1 and 2 show a structure which does not have sidewalls on the sides of the floating gate electrode for the purpose of charge storage, and therefore, these cases are not subjected to the problems mentioned above.

In view of the above, it will be apparent to those skilled in the art from this disclosure that there exists a need for an improved method of manufacturing a semiconductor memory device and an improved semiconductor memory device. This invention addresses this need in the art as well as other needs, which will become apparent to those skilled in the art from this disclosure.

SUMMARY OF THE INVENTION

It is therefore an object of the present invention to resolve the above-described problems, and to provide a semiconductor memory device which is capable of improving charge retention characteristics and thereby maintains a writing status even in high temperature abandonment, and a method of manufacturing such semiconductor memory device.

In accordance with one aspect of the present invention, a method of manufacturing a semiconductor memory device comprises the steps of: preparing a semiconductor substrate having a gate insulation film and a gate electrode, the gate insulation film being formed on a predetermined active region in the semiconductor substrate, and the gate electrode being formed on the gate insulation film; forming a first insulation film covering the gate electrode and at least a part of the semiconductor substrate; charging the first insulation film; and forming a second insulation film for charge storage on the first insulation film.

In accordance with one aspect of the present invention, a method of manufacturing a semiconductor memory device comprises the steps of: preparing a semiconductor substrate having a gate insulation film and a gate electrode, the gate insulation film being formed on a predetermined active region in the semiconductor substrate, and the gate electrode being formed on the gate insulation film; forming a first insulation film covering the gate electrode and at least a part of the semiconductor substrate; forming a second insulation film for charge storage on the first insulation film; forming a third insulation film on the second insulation film; and charging the third insulation film.

In accordance with one aspect of the present invention, a semiconductor memory device comprises a semiconductor substrate, a gate insulator formed on the semiconductor substrate, a gate electrode formed on the gate insulator, and sidewall spacers formed on parts of the semiconductor substrate and continuously on the sides of the gate electrode, respectively, each sidewall spacer including a first insulation film being charged and a second insulation film for charge storage.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. This embodiment will show a two bits per cell system MONOS structured nonvolatile semiconductor memory device (hereinafter to be referred to simply as a semiconductor memory device) 100 as an example of the present invention.

Structure

Figure 1:
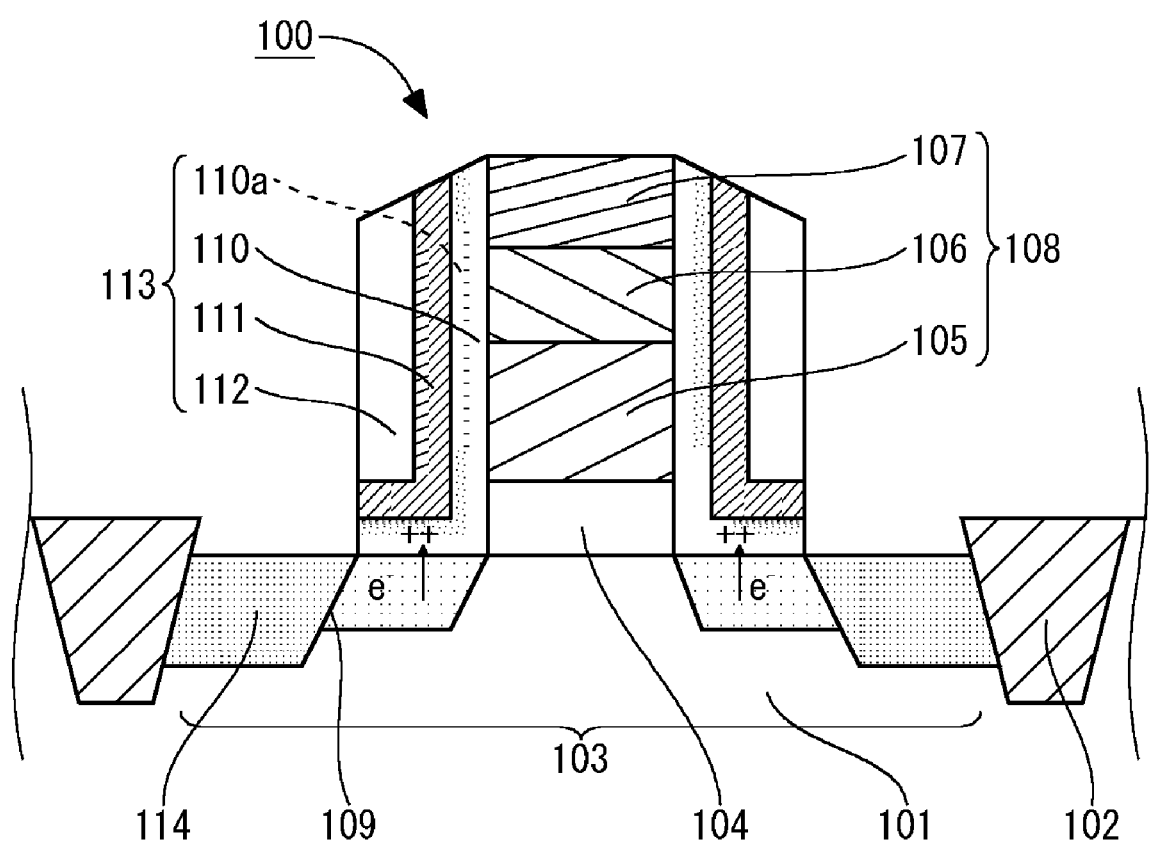
FIG. 1 is a sectional view of a semiconductor memory device according to a first embodiment of the present invention.

FIG. 1 is a sectional view of the semiconductor memory device 100 when cut vertically with respect to a substrate. As shown in FIG. 1, the semiconductor memory device 100 has a structure in which lightly doped regions, i.e. lightly doped drains (hereinafter to be referred to as LDDs) 109 and highly doped regions 114 are formed in an active region 103 in a semiconductor substrate (i.e. a silicon substrate) 101, and in which a gate oxide (also called a gate insulator) 104, a gate electrode 108 and sidewall spacers 113 are formed on the active region 103.

In the above structure, the active region 103 in which a semiconductor element is formed is defined in the silicon substrate 101 by having field oxides (which are also called element isolating insulation films) 102 formed in field regions where the semiconductor element is not formed. In this silicon substrate 101, at least in the active region 103, positive ions or negative ions can be doped for the purpose of threshold adjustment.

The field oxides 102 can be formed using an STI (shallow trench isolation) method, for instance. However, the method of forming the field oxides 102 is not limited to this STI method, but it is also possible to use other methods such as a LOCOS (local oxidation of silicon) method or the like.

The gate oxide 104 on the active region 103 is made of silicon oxide (e.g. $SiO_2$) for instance, and the thickness thereof may be set to 80 Å (angstrom) for instance.

The gate electrode 108 formed on the gate oxide 104 is what is termed a floating gate which is electrically floating. In this embodiment, the gate electrode 108 has a three-layer structure. Immediately above the gate oxide 104, a polysilicon film 105, which includes phosphorous ions ($P^+$) for instance, is formed, and the thickness thereof may be set to 1000 Å for instance. On the polysilicon film 105, a silicide (WSix) film 106 is formed. Here, the WSix layer 106 is formed by silicidizing silicon (Si) using tungsten (W) etc., and a thickness thereof may be set to 700 Å for instance. On the WSix layer 106, an NSG (non-doped silicate glass) film 107 which is a silicon oxide film is formed, and a thickness thereof may be set to 700 Å for instance. Accordingly, the total thickness of the gate electrode 108 may become 2400 Å for instance.

In the active region 103, the LDDs 109 are formed so as to sandwich a region underneath the gate electrode 108. Furthermore, in the active region 103, the highly doped regions 114 are formed in regions sandwiching the region where the pair of LDDs 109 are sandwiching the region underneath the gate electrode 108. The highly doped region 114 functions as a source or a drain. The LDD 109 functions as a spacer for separating the highly doped region 114, which is a source or a drain functioning as a contact, and a region where a channel is formed (i.e. a region underneath the gate electrode 108 in the active region 103). In the LDDs 109, positive ions such as arsenic ions (As⁺), for example, are doped in comparatively low concentration as compared to the highly doped regions 114, for instance. On the other hand, as mentioned above, the highly doped regions 114 are regions which are a source or drain that function as contacts, and where positive ions such as arsenic ions (As⁺), for example, are doped in comparatively high concentration.

The sidewall spacers 113 formed on both sides of the gate electrode 108 extend from the LDDs 109 along the sides of gate electrode 108, respectively. In this embodiment, the sidewall spacer 113 has a three-layer structure. On each side of the gate electrode 108 and directly above the LDD 109, a mask oxide film 110 is formed using silicon oxide (SiO$_2$). The mask oxide film 110 may be formed to a thickness of 100 Å for instance. On the mask oxide film 110, a silicon nitride (SiN) film 111 for charge storage is formed. In the following, this film will be referred to as a charge storage silicon nitride film 111. The charge storage silicon nitride film 111 may be formed to a thickness of 100 Å for instance. On the charge storage silicon nitride film 111, an NSG film 112 is formed. The NSG film 112 may be formed to a thickness of 400 Å for instance. Here, the thickness of each layer forming the sidewall spacer 113 is a thickness measured from the side of the gate electrode 108.

Among the layers forming each sidewall spacers 113, the mask oxide film 110 has nitrogen doped on the surface thereof or from the surface thereof to the inner side thereof (to the under surface of the mask oxide film 110, i.e. an interface between the mask oxide film 110 and the LDD 109, if appropriate). The region where nitrogen atoms are doped is called a nitrogen doped region 110a. The nitrogen atoms doped to the mask oxide film 110 function as positive fixed charges. Accordingly, in the mask oxide film 110, an electric field is formed by the nitrogen atoms in a direction in which negatively charged hot carriers (e⁻) are drawn to the side of the charge storage silicon nitride films 111 (i.e. in the vertical direction in the drawings).

Figure 2:
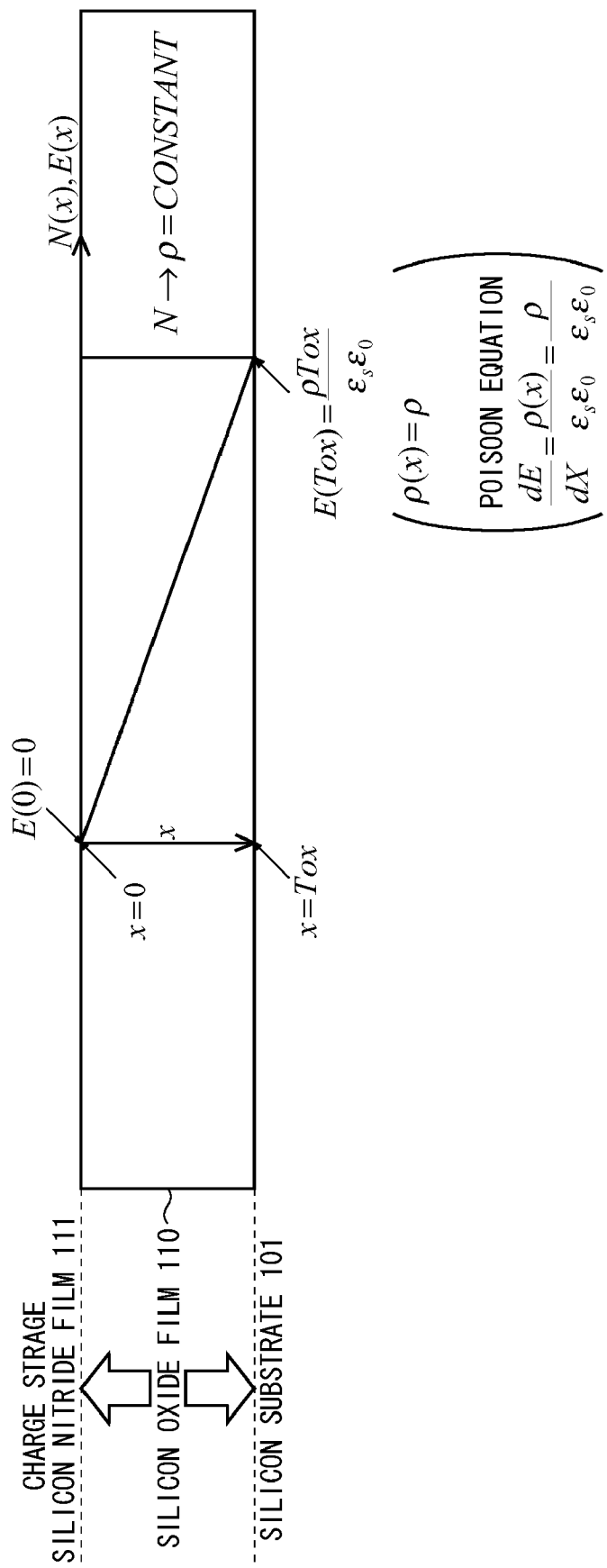
FIG. 2 is an explanatory diagram of an electric field E(x) produced inside a mask oxide film in the first embodiment of the present invention when nitrogen atoms are diffused uniformly inside the mask oxide film.

Here, as shown in FIG. 2, for example, if the nitrogen atoms are diffused uniformly inside the mask oxide film 110, i.e., if the charges inside the mask oxide film 110 are distributed evenly, and therefore a charge density inside the mask oxide film 110 is made constant, an electric field E(x) produced inside the mask oxide film 110 may be represented by Formula 1 shown below. In Formula 1, 'x' represents a distance from the bottom surface of the charge storage silicon nitride film 111 to the upper surface of the silicon substrate 101, 'ρ' represents a charge density inside the mask oxide film 110 (which is proportional to a density of nitrogen atoms), '$\varepsilon_s$' represents a specific inductive capacity of the mask oxide film 110, and '$\varepsilon_0$' represents an electrical constant.

$$E(x) = \frac{\rho}{\varepsilon_s \varepsilon_0} x \qquad < \text{Formula 1} >$$

In this way, by diffusing nitrogen atoms inside the mask oxide film 110, an electric field is formed in a direction in which negatively charged hot carriers (e⁻) are drawn to the side of the charge storage silicon nitride film 111. In other words, it will be possible to accelerate the hot carriers, which have entered into the mask oxide film 110 at the time of writing, in the direction of the charge storage silicon nitride film 111, within the mask oxide film 110. Thereby, it will be possible to make the hot carriers which have entered into the mask oxide film 110 reach the charge storage silicon nitride film 111, or an interface between the charge storage silicon nitride film 111 and the mask oxide film 110, without fail. As a result, the charge retention characteristic brought in by the hot carriers can be improved.

Manufacturing Method

Now, a method of manufacturing the semiconductor memory device 100 according to the first embodiment of the present invention will be described in detail with reference to the drawings. FIG. 3A to FIG. 4C are diagrams showing processes of manufacturing the semiconductor memory device 100 of this embodiment.

In this manufacturing method, first, a silicon substrate 101 in which predetermined ions are doped for the purpose of threshold adjustment is prepared. Then, using an STI method for instance, field oxides 102 are formed in the surface of the silicon substrate 101. Thereby, the field regions and the active regions 103 are determined in the surface of the silicon substrate 101.

Next, by forming a silicon oxide film on the surface of the silicon substrate 101 using a wet-oxidation treatment, a gate oxide 104 having a thickness of about 80 Å, for instance, is formed on the active region 103 divided by the field oxide 102.

Next, by depositing polysilicon that includes phosphorus ions on the entire surface of the silicon substrate 101 using a CVD (Chemical Vapor Deposition) method for instance, a polysilicon film 105 having a thickness of 1000 Å and that includes phosphorus ions is formed over the silicon substrate 101.

Next, by depositing tungsten silicide over the silicon substrate 101 using a CVD method or a sputtering method, a WSix film 106 which is a tungsten silicide film having a thickness of about 700 Å is formed on the polysilicon film 105.

Figure 3A:
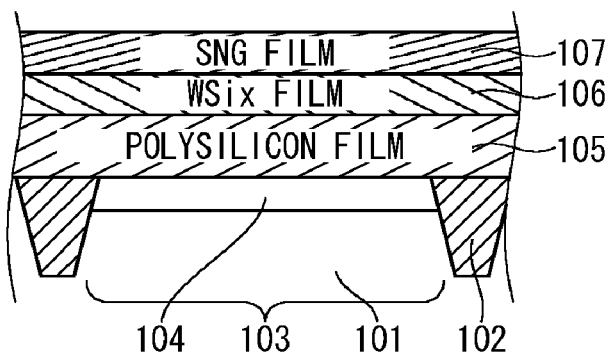
FIG. 3A to FIG. 4C are diagrams showing processes of manufacturing the semiconductor memory device according to the present invention.

Next, by depositing silicon over the silicon substrate 101 using a CVD method, an NSG film 107 having a thickness of about 700 Å is formed on a WSix film 106. Through the above described processes, the structure as shown in FIG. 3A is obtained.

Figure 3B:
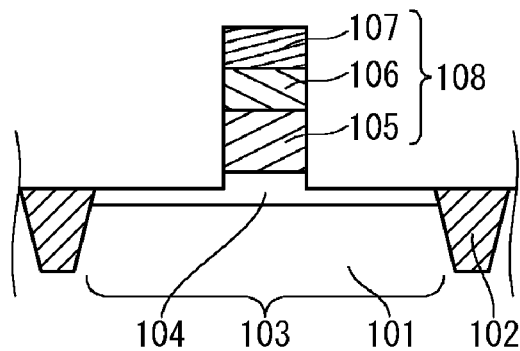

Next, by processing the multilayer film including the polysilicon film 105, the WSix film 106, and the NSG film 107 using a known photolithographic process and a known dry etching process, a gate electrode 108 is formed on the gate oxide 104, as shown in FIG. 3B. This gate electrode 108 having such multilayer structure is also called a WSix polycide electrode. In addition, the dry etching process for forming the gate electrode 108 is executed in such a way that the gate oxide 104 is not removed completely. By this arrangement, as shown in FIG. 3B, a thin gate oxide 104 remains in the active region 103 except for a region underneath the gate electrode 108.

Figure 3C:
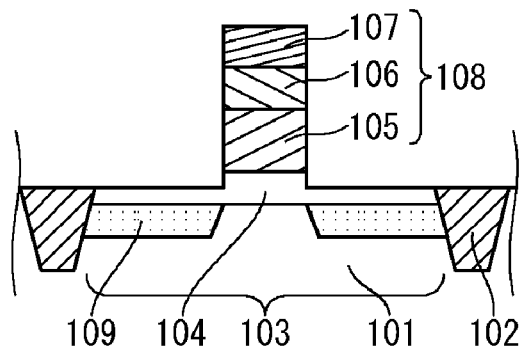

Next, by implanting arsenic ions (As⁺) into the silicon substrate 101 while using the gate electrode 108 and the field oxides 102 as masks, LDDs 109 which are the lightly doped regions are formed in the active region 103 except for the region underneath the gate electrode 108, as shown in FIG. 3C. In this process, arsenic ions are accelerated, at around 30 KeV (kilo electronvolt) for instance, and the dose amount thereof is set to around 1.0×10¹⁴/cm² for instance.

Figure 3D:
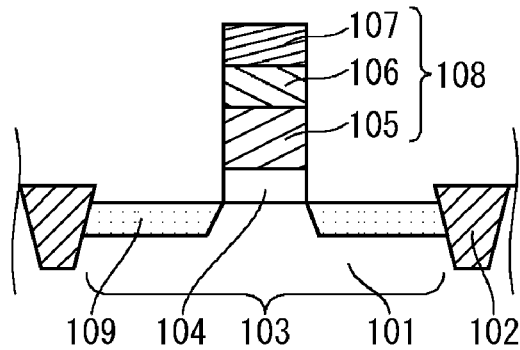

Next, as shown in FIG. 3D, the thin gate oxide 104 which has remained in the active region 103 except for the region underneath the gate electrode 108, when the gate electrode 108 was formed, is removed using a fluorinated acid, for instance.

Figure 4A:
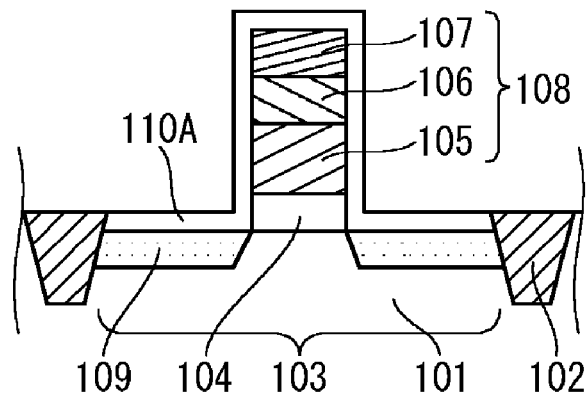

Next, by forming a silicon oxide film on the surface of the LDDs 109 and the gate electrode 108 using a diluting dry-oxidation treatment of a temperature less than 1000° C., a mask oxide film 110A having a thickness of about 100 Å is formed on the surfaces of the LDDs 109 and the gate electrode 108, as shown in FIG. 4A.

Figure 4B:
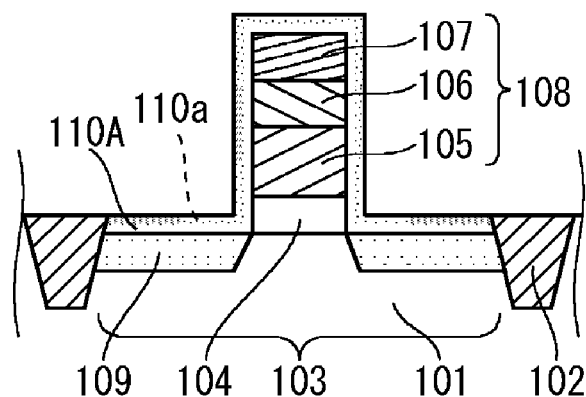

Next, by plasma-nitriding the mask oxide film 110A using a SPA (Slot Plane Antenna) technique or a DPN (Decoupled Plasma Nitridation) technique or the like, or by annealing the mask oxide film 110 in the presence of oxidized nitrogen ($N_2O$) for instance, nitrogen atoms are diffused in the surface or from the surface to inside of the mask oxide film 110A, as shown in FIG. 4B. By this process, a nitrogen doped region 110a is formed in the upper part of the mask oxide 110A. In addition, nitrogen atoms can be diffused to the under surface of the mask oxide film 110A, i.e. the boundary faces between the mask oxide film 110A and the LDDs 109. If plasma-nitriding is conducted, most nitrogen atoms will be distributed near the surface of the mask oxide film 110A. On the other hand, if annealing in the presence of oxidizing nitrogen is conducted, most nitrogen atoms will be diffused in the mask oxide film 110 near the boundary face between the mask oxide film 110A and the silicon substrate 101. Therefore, by using combination of plasma-nitriding and annealing in the presence of oxidizing nitrogen, it becomes possible to uniform the distribution of nitrogen atoms in the mask oxide film 110A partially.

Figure 4C:
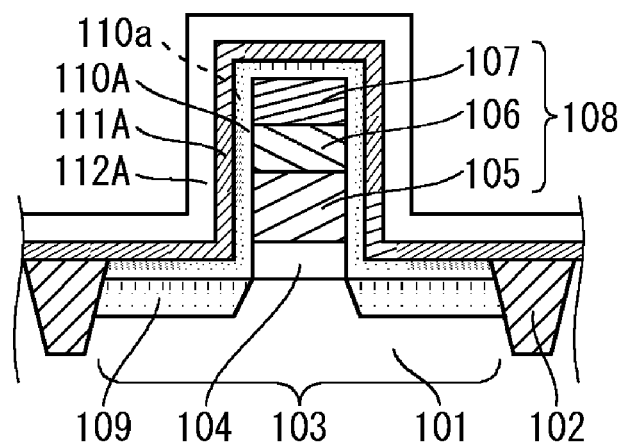

Next, by depositing silicon nitride and silicon on the mask oxide film 110A in which nitrogen atoms are diffused, sequentially, using a LP (Low Pressure) CVD method for instance, a silicon nitride film 111A for charge storage (i.e. a charge storage silicon nitride films 111A) and an NSG film 112A are formed over the silicon substrate 101, as shown in FIG. 4C. The silicon nitride film 111A has a thickness of about 100 Å, and the NSG film 112A has a thickness of about 400 Å.

Next, by anisotropic-dry-etching the multilayer film including the NSG film 112A, the charge storage silicon nitride film 111A and the mask oxide film 110A, for instance, sidewall spacers 113 each of which includes these processed films (a mask oxide film 110, a charge storage silicon nitride film 111 and a NSG film 112) are formed on the sides of the gate electrode 108 while exposing the surfaces of the LDDs 109, except for regions underneath the gate electrode 108 and the sidewall spacers 113. Then, by implanting predetermined ions, such as arsenic ions or phosphorus ions, into the exposed LDDs 109, highly doped regions 114 that each function as a source or a drain are formed in the upper parts of the LDDs 109.

Taking the processes described above, the two bits per cell system MONOS structured nonvolatile semiconductor memory device 100 shown in FIG. 1 can be provided, and the semiconductor memory device 100 will be able to store electrical charge in the charge storage silicon nitride films 111 constructing the sidewall spacers 113 which are formed on the sides of the gate electrode 108 (which is a WSix polycide electrode).

As described above, the semiconductor memory device 100 according to the first embodiment of the present invention has a semiconductor substrate (101), a gate insulation film (104) formed on the semiconductor substrate (101), a gate electrode (108) formed on the gate insulation film (104), and sidewall spacers (113) formed on at least some parts of the semiconductor substrate (101) and along both sides of the gate electrode (108), each sidewall spacer (113) having a multilayer structure including a charge storage insulation layer (111) and an insulation film (110) which is electrically charged.

In the semiconductor memory device 100 according to this embodiment, among the layers in the multilayer structured sidewall spacer (113) which is formed on part of the semiconductor substrate (101) and along each side of the gate electrode (108), one of them except the charge storage insulation layer (111) is electrically charged. In this embodiment, the mask insulation film 110 that is a silicon oxide film is the electrically charged layer among the layers forming the sidewall spacer (113). By having such electrically charged layer in the sidewall spacer (113), it is possible to form on each side of the gate electrode (108) an electric field in a direction that is vertical with respect to the semiconductor substrate (101), i.e., in a direction in which carriers are drawn into the side of the charge storage insulation layer (111) from the side of the semiconductor substrate (101). By such arrangement, it is possible to draw in the hot carriers generated in a channel formed in the semiconductor substrate (101), for instance, to the charge storage insulation layer (111) or to a vicinity of an interface between the charge storage insulation layer (111) and the other layer (i.e. the mask insulation film 110 in this particular embodiment) with more certainty. As a result, a charge retention characteristic in the sidewall spacer (113) that functions as a data storage can be improved.

Furthermore, in the manufacturing method of the semiconductor memory device 100 according to the first embodiment of the present invention, a semiconductor substrate (101) having a gate insulation film (104) formed in a predetermined active region (103) and a gate electrode (108) formed on the gate insulation film (104) is prepared, a first insulation film (110A) covering at least a part of the semiconductor substrate (101) and the gate electrode (108) is formed, the first insulation film (110A) is electrically charged, and a second insulation film (111A) for the purpose of charge storage is formed on the first insulation film (110A).

In the manufacturing method of the semiconductor memory device 100 according to this embodiment, in a multilayer structured sidewall spacer (113) which is formed on part of the semiconductor substrate (101) and along each side of the gate electrode (108), the first insulation film (110A) formed between the semiconductor substrate (101) and the charge storage insulation layer (111A) is electrically charged. By having such electrically charged layer in the sidewall spacer (113), it is possible to form on each side of the gate electrode (108) an electric field in a direction that is vertical with respect to the semiconductor substrate (101), i.e., in a direction that carriers are drawn into the side of the charge storage insulation layer (111A) from the side of the semiconductor substrate (101). By such arrangement, it is possible to draw in the hot carriers generated in a channel formed in the semiconductor substrate (101), for instance, to the charge storage insulation layer (111A) or to the vicinity of an interface between the charge storage insulation layer (111A) and the other layer with more certainty. As a result, it is possible to manufacture a semiconductor memory device in which a charge retention characteristic in the sidewall spacer (113) that functions as a data storage is improved.

In this embodiment, the insulation film (110) is electrically charged by having nitrogen atoms, which are supposed to become fixed charges, doped thereto by conducting plasma nitridation or annealing in the presence of oxidizing nitrogen, or by applying both of the above. However, as long as it is possible to prevent the charges charged into the insulation film (110) from flowing out to the side of the semiconductor substrate (101) or the gate electrode (108), for instance, any other methods such as ion implantation etc. can be applied for this case.

Second Embodiment

Next, a second embodiment of the present invention will be described in detail with reference to the drawings. In the following, as for the structures that are the same as the first embodiment, the same reference numbers will be used, and redundant explanations of those structural elements will be omitted.

As with the first embodiment, this embodiment will show a two bits per cell system MONOS structured nonvolatile semiconductor memory device (i.e., a semiconductor memory device) 200 as an example of the present invention.

Structure

Figure 5:
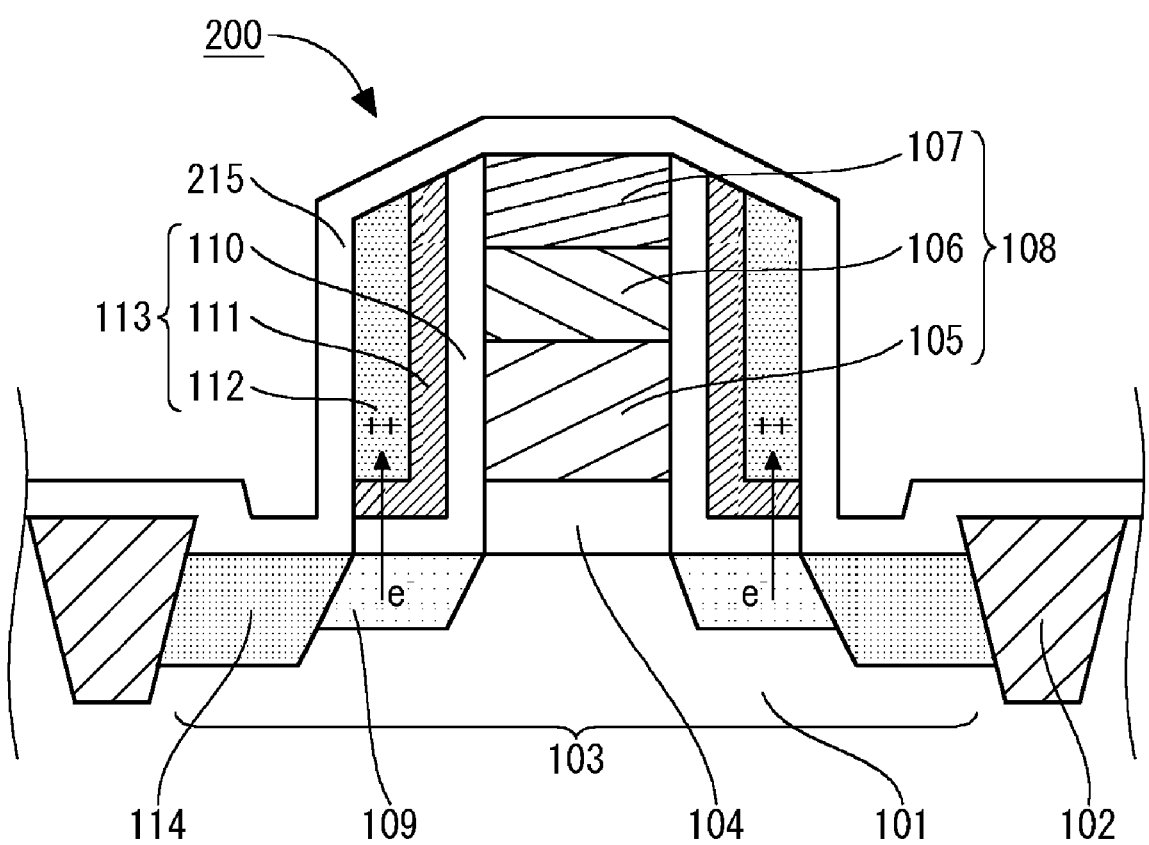
FIG. 5 is a sectional view of a semiconductor memory device according to a second embodiment of the present invention.

FIG. 5 is a sectional view of the semiconductor memory device 200 when cut vertically with respect to a substrate. As shown in FIG. 5, the semiconductor memory device 200 has the same structure as the semiconductor memory device 100 of the first embodiment except that the whole surface of the silicon substrate 101 having the gate electrode 108 and the sidewall spacers 113 is covered by an LP (Low Pressure)-TEOS oxide film 215 which has a thickness of about 100 Å for instance. Furthermore, in the semiconductor memory device 200 of this embodiment, instead of having nitrogen atoms implanted into the mask oxide film 110, argon ions (Ar⁻) are implanted into the NSG film 112 via the LP-TEOS oxide film 215.

The LP-TEOS oxide film 215 is a silicon oxide (SiO$_2$) film formed by degrading tetraethyl orthosilicate (Si (OC$_2$H$_5$)$_4$) in an LP-CVD machine. This LP-TEOS oxide film 215 functions as a covering film for preventing electrical charge stored in the NSG films 112 from drifting out through processes which will be described later on.

As described above, argon ions (Ar⁺) are implanted into each NSG film 112, of which surface is covered by the LP-TEOS oxide film 215, via the LP-TEOS oxide film 215. At this time, by releasing secondary electrons from the NSG film 112, the NSG film 112 is charged positively. Due to the positive charge generated in the NSG film 112 by this means, an electric field in a direction that negative charged hot carriers (e−) are drawn to the side of the charge storage silicon nitride film 111 (i.e., in the vertical direction in the drawings) is formed in the charge storage silicon nitride film 111 and the mask oxide 110. That is, as with the first embodiment, it is made possible to accelerate the hot carriers, which have entered into the mask oxide films 110 at the time of writing, in the direction of the charge storage silicon nitride film 111, within the mask oxide film 110. Thereby, it will be possible to make the hot carriers which have entered into the mask oxide film 110 reach the charge storage silicon nitride film 111, or an interface between the charge storage silicon nitride film 111 and the mask oxide film 110, without fail. As a result, a charge retention characteristic brought in by the hot carriers can be improved.

Manufacturing Method

Figure 6A:
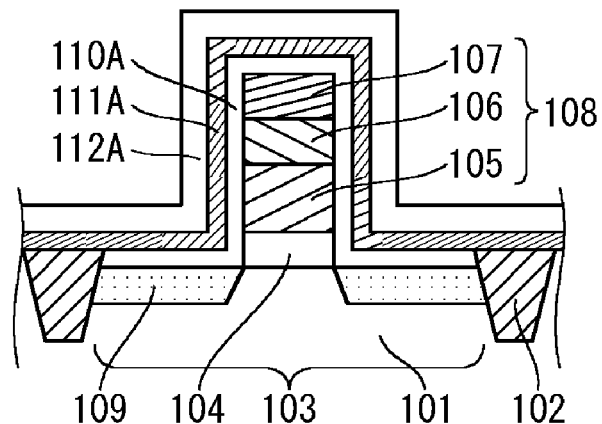
FIG. 6A to FIG. 6C are diagrams showing processes of manufacturing the semiconductor memory device according to the second embodiment of the present invention.
Figure 6B:
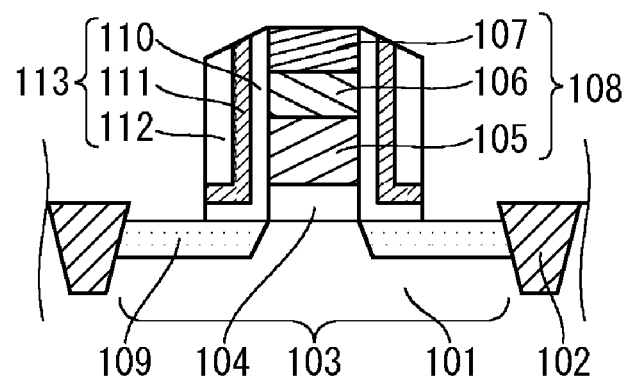
Figure 6C:
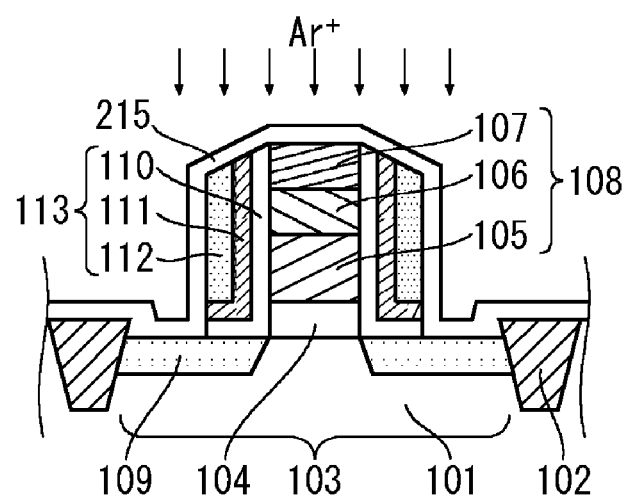

Now, a method of manufacturing the semiconductor memory device 200 according to the second embodiment of the present invention will be described in detail with reference to the drawings. FIG. 6A to FIG. 6C are diagrams showing processes of manufacturing the semiconductor memory device 200 of this embodiment. In the following, the same processes as the first embodiment will be referred, and redundant explanations of those processes will be omitted.

In this manufacturing method, first, using the processes shown in FIG. 3A to 4A, a silicon substrate 101 having a structure in which the gate oxide 104 and the gate electrode 108 covered by the mask oxide 110A are formed over the active region 103 divided by the field oxides 102, and the LDDs 109 are formed in the active region 103 is prepared.

Next, using an LP-CVD method, for instance, a silicon nitride (SiN) film 111A for charge storage (i.e. a charge storage silicon nitride film 111A) and an NSG film 112A for forming sidewall spacers are formed, sequentially, over the entire surface of the silicon substrate 101 where the gate electrode 108 and the mask oxide film 110A are formed, as shown in FIG. 6A. The silicon nitride film 111A has a thickness of about 100 Å, for instance, and the NSG film 112A has a thickness of about 400 Å, for instance.

Next, by anisotropic-dry-etching the multilayer film including the NSG film 112A, the charge storage silicon oxide film 111A and the mask oxide 110A, for instance, sidewall spacers 113 each of which includes these processed films (a mask oxide film 110, a charge storage silicon nitride film 111 and a NSG film 112) are formed on the sides of the gate electrode 108 while exposing the surfaces of the LDDs 109 except for regions underneath the gate electrode 108 and the sidewall spacers 113, as shown in FIG. 6B.

Next, an LP-TEOS oxide film 215 having a thickness of about 100 Å, for instance, is formed over the entire surface of the silicon substrate 101, in which the sidewall spacers 113 are formed and parts of the LDDs 109 are exposed, using an LP-CVD method for instance, as shown in FIG. 6C. Then, by implanting argon ions (Ar⁺) into the LP-TEOS oxide film 215, the NSG films 112 are charged positively. In this process, argon ions are accelerated at around 50 KeV for instance, using an ion implanting apparatus, and the dose amount thereof is set to around $1.0 \times 10^{14}/cm^2$ for instance.

Next, by implanting predetermined ions, such as arsenic ions or phosphorus ions, into regions where the sidewall spacers 114 are not formed, i.e., parts of the LDDs 109 exposed in the process shown in FIG. 6B, through the LP-TEOS oxide film 215, highly doped regions 114 each of which functions as a source or a drain is formed in the upper parts of the LDDs 109.

Taking the processes described above, the two bits per cell system MONOS structured nonvolatile semiconductor memory device 200 shown in FIG. 5 can be provided, the semiconductor memory device 200 being able to store electrical charge in the charge storage silicon nitride films 111 constructing the sidewall spacers 113 which are formed on the sides of the gate electrode 108 (which is a WSix polycide electrode). In addition, parts of the LP-TEOS oxide film 215 formed on the gate electrode 108 are removed according to need in the process of electrically connecting the gate electrode 108 and other conductive patterns.

As described above, as with the first embodiment of the present invention, the semiconductor memory device 200 according to the second embodiment of the present invention has a semiconductor substrate (101), a gate insulation film (104) formed on the semiconductor substrate (101), a gate electrode (108) formed on the gate insulation film (104), and sidewall spacers (113) formed on at least some parts of the semiconductor substrate (101) and along both sides of the gate electrode (108), each sidewall spacer (113) having a multilayer structure including a charge storage insulation layer (111) and an insulation film (112) which is electrically charged.

In the semiconductor memory device 200 according to this embodiment, among the layers in the multilayer structured sidewall spacer (113) which is formed on part of the semiconductor substrate (101) and along each side of the gate electrode (108), one of them except the charge storage insulation layer (111) is electrically charged. In this embodiment, the NSG film 112 being a silicon oxide film is the electrically charged layer among the layers forming the sidewall spacer (113). By having such electrically charged layer in the sidewall spacer (113), it is possible to form on each side of the gate electrode (108) an electric field in a direction that is vertical with respect to the semiconductor substrate (101), i.e., in a direction in which carriers are drawn into the side of the charge storage insulation layer (111) from the side of the semiconductor substrate (101). By such arrangement, it is possible to draw in the hot carriers generated in a channel formed in the semiconductor substrate (101), for instance, to the charge storage insulation layer (111) or to a vicinity of an interface between the charge storage insulation layer (111) and the other layer (i.e. the mask insulation film 110 in this particular embodiment) with more certainty. As a result, a charge retention characteristic in the sidewall spacer (113) functioning as a data storage can be improved.

Furthermore, in the manufacturing method of the semiconductor memory device 200 according to the second embodiment of the present invention, a semiconductor substrate (101) having a gate insulation film (104) formed in a predetermined active region (103) and a gate electrode (108) formed on the gate insulation film (104) is prepared, a first insulation film (110A) covering at least a part of the semiconductor substrate (101) and the gate electrode (108) is formed, a second insulation film (111A) for the purpose of charge storage is formed on the first insulation film (110A), a third insulation film (112A) is formed on the second insulation film (111A), and the third insulation film (112A) is electrically charged.

In the manufacturing method of the semiconductor memory device 200 according to this embodiment, in a multilayer structured sidewall spacer (113) which is formed on part of the semiconductor substrate (101) and along each side of the gate electrode (108), the third insulation film (112A) formed over the second insulation film (111A) for the purpose of charge storage is electrically charged. By having such electrically charged layer in the sidewall spacer (113), it is possible to form on each side of the gate electrode (108) an electric field in a direction that is vertical with respect to the semiconductor substrate (101), i.e. in a direction that carriers are drawn into the side of the charge storage insulation layer (111A) from the side of the semiconductor substrate (101). By such arrangement, it is possible to draw in the hot carriers generated in a channel formed in the semiconductor substrate (101), for instance, to the charge storage insulation layer (111A) or to a vicinity of an interface between the charge storage insulation layer (111A) and the other layer with more certainty. As a result, it is possible to manufacture a semiconductor memory device in which a charge retention characteristic in the sidewall spacer (113) functioning as a data storage is improved.

In this embodiment, the insulation film (i.e. the NSG film 112 which is a silicon oxide film in this embodiment) is electrically charged by implanting argon ions into it. However, as long as it is possible to prevent the charges charged into the insulation film (112) from flowing out to the side of the semiconductor substrate (101) or the gate electrode (108), for instance, any other methods such as plasma nitridation etc. can be applied for this case. In addition, in this embodiment, the flow of electrical charge out from the charged insulation film (112) is prevented by covering the charged insulation film (112) with the insulation film (i.e. the LP-TEOS oxide film 215 in this embodiment).

Third Embodiment

Next, a third embodiment of the present invention will be described in detail with reference to the drawings. In the following, as for the structures that are the same as the first or second embodiment, the same reference numbers will be used, and redundant explanations of those structural elements will be omitted.

As with the first embodiment, this embodiment will show a two bits per cell system MONOS structured nonvolatile semiconductor memory device (i.e., a semiconductor memory device) 300 as an example of the present invention.

Structure

Figure 7:
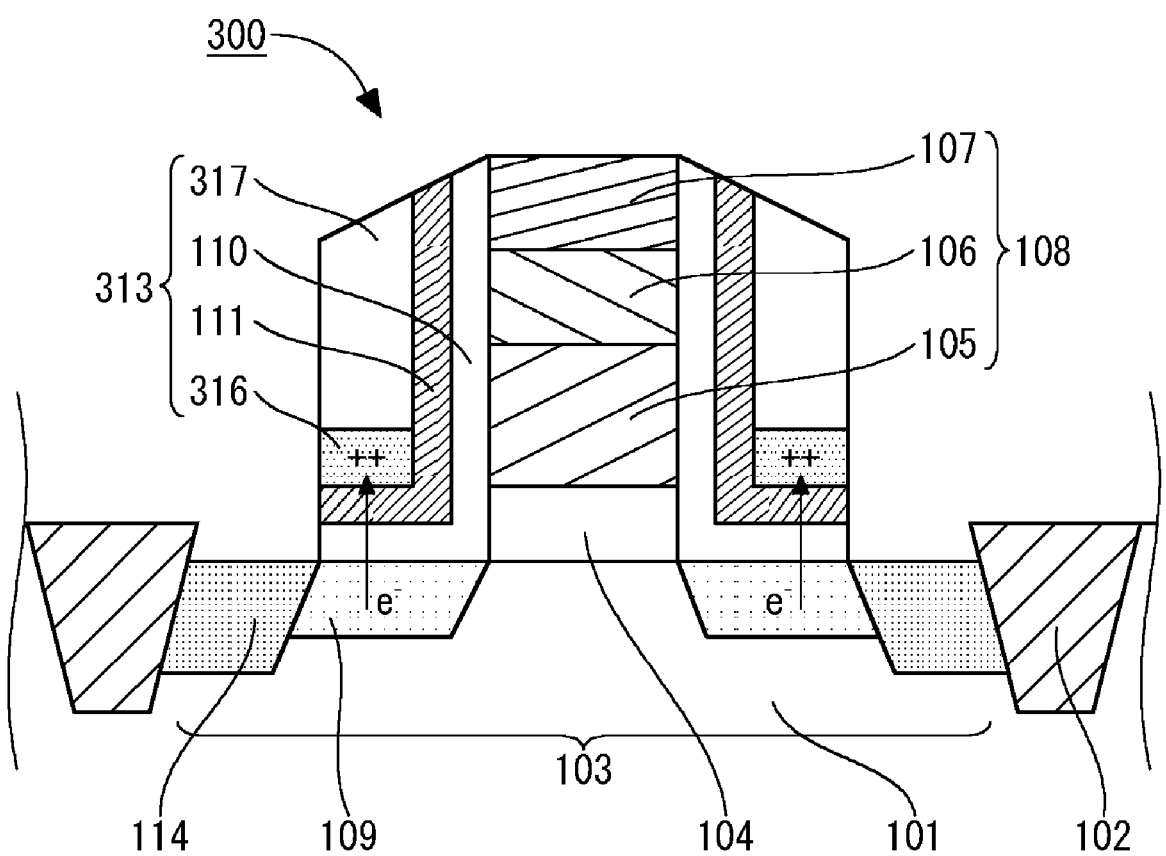
FIG. 7 is a sectional view of a semiconductor memory device according to a third embodiment of the present invention.

FIG. 7 is a sectional view of the semiconductor memory device 300 when cut vertically with respect to a substrate. As shown in FIG. 7, the semiconductor memory device 300 has the same structure as the semiconductor memory device 100 of the first embodiment except that the sidewall spacers 113 are replaced with sidewall spacers 313. The sidewall spacers 313 have the same structure as the sidewall spacers 113 of the first embodiment except that the NSG film 112 is replaced with an HDP (High-Density Plasma) oxide film 316 and an LP-TEOS oxide film and an PSG (Phospho-Silicon Glass) film. This embodiment will show a case where a LP-TEOS oxide film 317 is used. Furthermore, in this embodiment, instead of implanting nitrogen atoms into the mask oxide film 110, argon ions (Ar⁺) are implanted into the HDP oxide film 316 being a silicon oxide film.

As with the LP-TEOS oxide film 215 in the second embodiment, the LP-TEOS oxide film 317 is a silicon oxide ($SiO_2$) film formed by degrading tetraethyl orthosilicate ($Si(OC_2H_5)_4$) in an LP-CVD machine.

The HDP oxide film 316 is a silicon oxide film formed using a high-density plasma (HDP) CVD method. In the HDP-CVD method, because of using plasma-activated ions, it is possible to proceed with film formation while etching a film overhanging an upper part of a trench. Accordingly, it is possible to improve the burying performance and the step coatability of the HDP oxide film 316.

The HDP oxide film 316 is formed in an under part of each sidewall spacer 313, more specifically, it is formed directly above each charge storage silicon nitride film 111, and it has a thickness of about 500 Å for instance. As described above, argon ions (Ar⁺) are implanted into each HDP oxide film 316. At this time, by releasing secondary electrons form the HDP oxide film 31, the HDP oxide film is charged positively. Due to the positive charge generated in the HDP film 316 by this means, an electric field in a direction in which negative charged hot carriers (e−) are drawn to the side of the charge storage silicon nitride film 111 (i.e. in a vertical direction in the drawings) is formed in the charge storage silicon nitride film 111 and the mask oxide 110. That is, as with the first and second embodiments, it will be possible to accelerate the hot carriers, which have entered into the mask oxide films 110 at the time of writing, in a direction of the charge storage silicon nitride film 111, within the mask oxide film 110. Thereby, it will be possible to make the hot carriers which have entered into the mask oxide film 110 reach the charge storage silicon nitride film 111, or an interface between the charge storage silicon nitride film 111 and the mask oxide film 110, without fail. As a result, a charge retention characteristic brought in by the hot carriers can be improved. Furthermore, by implanting the fixed positive charge only in the HDP oxide film 316 which is disposed directly above the charge storage silicon oxide film 111 as in this embodiment, it is possible to limit the distribution range of the fixed charge. By this arrangement, it is possible to prevent characteristics of other semiconductor elements from deteriorating due to influences of the electric field generated by the fixed charge.

Manufacturing Method

Figure 8A:
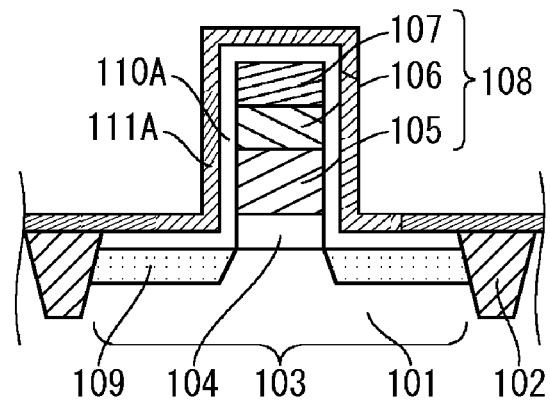
FIG. 8A to FIG. 8C are diagrams showing processes of manufacturing the semiconductor memory device according to the third embodiment of the present invention.
Figure 8B:
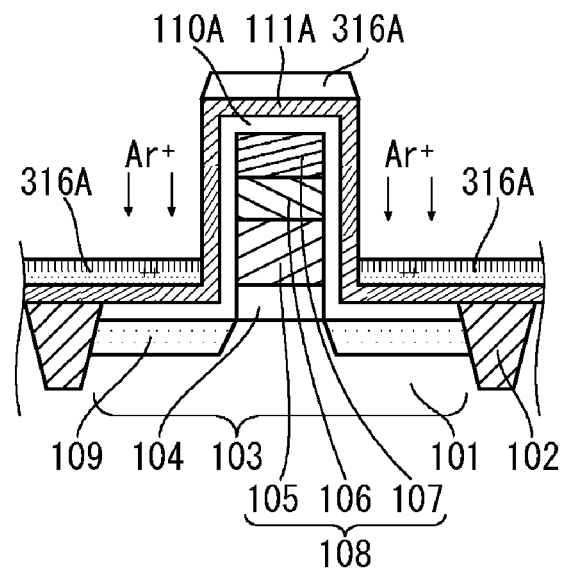
Figure 8C:
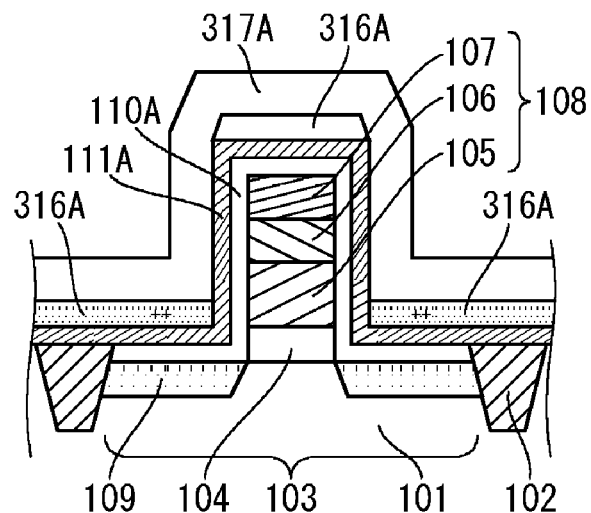

Now, a method of manufacturing the semiconductor memory device 300 according to the third embodiment of the present invention will be described in detail with reference to the drawings. FIG. 8A to FIG. 8C are diagrams showing processes of manufacturing the semiconductor memory device 300 of this embodiment. In the following, the same processes as the first or second embodiment will be referred, and redundant explanations of those processes will be omitted.

In this manufacturing method, first, using the processes shown in FIG. 3A to 4A, a silicon substrate 101 having a structure in which the gate oxide 104 and the gate electrode 108 covered by the mask oxide 110A are formed over the active region 103 divided by the field oxides 102, and the LDDs 109 are formed in the active region 103 is prepared.

Next, using an LP-CVD method, for instance, a silicon nitride (SiN) film 111A for charge storage (i.e., a charge storage silicon nitride film 111A) is formed, sequentially, over the entire surface of the silicon substrate 101 where the gate electrode 108 and the mask oxide film 110A are formed, as shown in FIG. 8A. The silicon nitride film 111A has a thickness of about 100 Å, for instance.

Next, as shown in FIG. 8B, an HDP oxide films 316A each of which has a thickness of about 500 Å are formed on flat parts of the charge storage silicon nitride film 111A using an HDP-CVD method for instance. Then, by implanting argon ions (Ar$^+$) into the HDP oxide films 316A, the HDP oxide films 316A are charged positively. In this process, argon ions are accelerated at around 50 KeV for instance, using an ion implanting apparatus, and the dose amount thereof is set to around $1.0 \times 10^{14}/cm^2$ for instance.

Next, using an LP-CVD method, for instance, an LP-TEOS oxide film 317A is formed on the charge storage silicon oxide film 111A and the HDP oxide films 316A, as shown in FIG. 8C. The LP-TEOS oxide film 317A has a thickness of about 400 Å, for instance.

Next, by anisotropic-dry-etching the multilayer film including the LP-TEOS oxide film 317A, the HDP oxide films 316A, the charge storage silicon oxide film 111A and the mask oxide 110A, for instance, sidewall spacers 313 each of which includes these processed films (a mask oxide film 110, a charge storage silicon nitride film 111, a HDP oxide film 316 and a LP-TEOS oxide film 317) are formed on the sides of the gate electrode 108 while exposing the surfaces of the LDDs 109, except for regions underneath the gate electrode 108 and the sidewall spacers 113, as shown in FIG. 6B.

Next, by implanting predetermined ions, such as arsenic ions or phosphorus ions, into the exposed LDDs 109, highly doped regions 114 each of which functions as a source or a drain is formed in the upper parts of the LDDs 109.

Taking the processes described above, the two bits per cell system MONOS structured nonvolatile semiconductor memory device 300 shown in FIG. 7 can be provided, the semiconductor memory device 300 being able to store electrical charge in the charge storage silicon nitride films 111 constructing the sidewall spacers 313 which are formed on the sides of the gate electrode 108 (which is a WSix polycide electrode).

As described above, as with the first and second embodiments of the present invention, the semiconductor memory device 300 according to the third embodiment of the present invention has a semiconductor substrate (101), a gate insulation film (104) formed on the semiconductor substrate (101), a gate electrode (108) formed on the gate insulation film (104), and sidewall spacers (113) formed on at least some parts of the semiconductor substrate (101) and along both sides of the gate electrode (108), each sidewall spacer (313) having a multilayer structure including a charge storage insulation layer (111) and an insulation film (316) which is electrically charged.

In the semiconductor memory device 300 according to this embodiment, among the layers in the multilayer structured sidewall spacer (313) which is formed on part of the semiconductor substrate (101) and along each side of the gate electrode (108), one of them except the charge storage insulation layer (111) is electrically charged. In this embodiment, the HDP oxide film 316 being a silicon oxide film is the electrically charged layer among the layers forming the sidewall spacer (313). By having such electrically charged layer in the sidewall spacer (313), it is possible to form on each side of the gate electrode (108) an electric field in a direction that is vertical with respect to the semiconductor substrate (101), i.e., in a direction that carriers are drawn into the side of the charge storage insulation layer (111) from the side of the semiconductor substrate (101). By such arrangement, it is possible to draw in the hot carriers generated in a channel formed in the semiconductor substrate (101), for instance, to the charge storage insulation layer (111) or to a vicinity of an interface between the charge storage insulation layer (111) and the other layer (i.e., the mask insulation film 110 in this particular embodiment) with more certainty. As a result, a charge retention characteristic in the sidewall spacer (313) that functions as a data storage can be improved.

Furthermore, as with the second embodiment, in the manufacturing method of the semiconductor memory device 300 according to the third embodiment of the present invention, a semiconductor substrate (101) having a gate insulation film (104) formed in a predetermined active region (103) and a gate electrode (108) formed on the gate insulation film (104) is prepared, a first insulation film (110A) covering at least a part of the semiconductor substrate (101) and the gate electrode (108) is formed, a second insulation film (111A) for the purpose of charge storage is formed on the first insulation film (110A), a third insulation film (316A) is formed on the second insulation film (111A), and the third insulation film (316A) is electrically charged.

In the manufacturing method of the semiconductor memory device 300 according to this embodiment, in a multilayer structured sidewall spacer (313) which is formed on part of the semiconductor substrate (101) and along each side of the gate electrode (108), the third insulation film (316A) formed over the second insulation film (111A) for the purpose of charge storage is electrically charged. By having such electrically charged layer in the sidewall spacer (313), it is possible to form on each side of the gate electrode (108) an electric field in a direction that is vertical with respect to the semiconductor substrate (101), i.e., in a direction in which carriers are drawn into the side of the charge storage insulation layer (111A) from the side of the semiconductor substrate (101). By such arrangement, it is possible to draw in the hot carriers generated in a channel formed in the semiconductor substrate (101), for instance, to the charge storage insulation layer (111A) or to the vicinity of an interface between the charge storage insulation layer (111A) and the other layer with more certainty. As a result, it is possible to manufacture a semiconductor memory device in which a charge retention characteristic in the sidewall spacer (313) that functions as a data storage is improved.

In this embodiment, the insulation film (i.e. the HDP oxide film 316 which is a silicon oxide film in this embodiment) is electrically charged by implanting argon ions into it. However, as long as it is possible to prevent the charges charged into the insulation film (316) from flowing out to the side of the semiconductor substrate (101) or the gate electrode (108), for instance, any other methods such as plasma nitridation etc. can be applied for this case.

Furthermore, in this embodiment, the charged insulation film (316) is formed only on the flat parts of the insulation film (111) for charge storage, the flat parts being parallel with the surface of the semiconductor substrate (101). Therefore, even if a semiconductor element such as a transistor is formed near the semiconductor memory device 300 for instance, it is possible to prevent the semiconductor element from being influenced by the electric charge of the insulation films (316). Thereby, it becomes possible to prevent characteristics of peripheral circuitry such as transistors form deteriorating.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-052284. The entire disclosures of Japanese Patent Application No. 2005-052284 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus-function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor memory device, comprising:
   preparing a semiconductor substrate having a gate insulation film and a gate electrode, the gate insulation film being formed on a predetermined active region in the semiconductor substrate, and the gate electrode being formed on the gate insulation film;
   forming a first insulation film covering the gate electrode and at least a part of the semiconductor substrate;
   charging the first insulation film; and
   forming a second insulation film for charge storage on the first insulation film.

2. The method of manufacturing a semiconductor memory device according to claim 1, wherein
   the first insulation film is charged by doping nitrogen atoms therein.

3. The method of manufacturing a semiconductor memory device according to claim 1, wherein
   the first insulation film is charged by doping nitrogen atoms therein by plasma nitridation or annealing in a presence of oxidized nitrogen.

4. The method of manufacturing a semiconductor memory device according to claim 1, further comprising:
   forming a third insulation film on the second insulation film; and
   forming sidewall spacers on parts of the semiconductor substrate and continuously on the sides of the gate electrode, respectively, by etching the first to third insulation films.

5. A method of manufacturing a semiconductor memory device, comprising:
   preparing a semiconductor substrate having a gate insulation film and a gate electrode, the gate insulation film being formed on a predetermined active region in the semiconductor substrate, and the gate electrode being formed on the gate insulation film;
   forming a first insulation film covering the gate electrode and at least a part of the semiconductor substrate;
   forming a second insulation film for charge storage on the first insulation film;
   forming a third insulation film on the second insulation film; and
   charging the third insulation film.

6. The method of manufacturing a semiconductor memory device according to claim 5, wherein
   the third insulation film is charged by implanting predetermined ions therein.

7. The method of manufacturing a semiconductor memory device according to claim 6, wherein
   the predetermined ions are argon ions.

8. The method of manufacturing a semiconductor memory device according to claim 5, further comprising:
   forming a sidewall spacers on parts of the semiconductor substrate and continuously on the sides of the gate electrode, respectively, by etching the first to third insulation films; and
   forming a fourth insulation film covering the gate electrode, the sidewall spacers and at least a part of the semiconductor substrate.

9. The method of manufacturing a semiconductor memory device according to claim 6, further comprising:
   forming a sidewall spacers on parts of the semiconductor substrate and continuously on the sides of the gate electrode, respectively, by etching the first to third insulation films; and
   forming a fourth insulation film covering the gate electrode, the sidewall spacers and at least a part of the semiconductor substrate.

10. The method of manufacturing a semiconductor memory device according to claim 7, further comprising:

forming a sidewall spacers on parts of the semiconductor substrate and continuously on the sides of the gate electrode, respectively, by etching the first to third insulation films; and forming a fourth insulation film covering the gate electrode, the sidewall spacers and at least a part of the semiconductor substrate.

11. The method of manufacturing a semiconductor memory device according to claim 5, wherein
the third insulation film is formed only on flat parts of the second insulation film, the flat parts being parallel with the surface of the semiconductor substrate.

12. The method of manufacturing a semiconductor memory device according to claim 6, wherein
the third insulation film is formed only on flat parts of the second insulation film, the flat parts being parallel with the surface of the semiconductor substrate.

13. The method of manufacturing a semiconductor memory device according to claim 7, wherein
the third insulation film is formed only on flat parts of the second insulation film, the flat parts being parallel with the surface of the semiconductor substrate.

14. The method of manufacturing a semiconductor memory device according to claim 11, further comprising:

forming a fourth insulation film covering the first to third insulation films; and forming sidewall spacers on parts of the semiconductor substrate and continuously on the sides of the gate electrode, respectively, by etching the first to fourth insulation films.

15. The method of manufacturing a semiconductor memory device according to claim 12, further comprising:

forming a fourth insulation film covering the first to third insulation films; and forming sidewall spacers on parts of the semiconductor substrate and continuously on the sides of the gate electrode, respectively, by etching the first to fourth insulation films.

16. The method of manufacturing a semiconductor memory device according to claim 13, further comprising:

forming a fourth insulation film covering the first to third insulation films; and forming sidewall spacers on parts of the semiconductor substrate and continuously on the sides of the gate electrode, respectively, by etching the first to fourth insulation films.

* * * * *